United States Patent
Lai et al.

(10) Patent No.: US 7,368,761 B1
(45) Date of Patent: May 6, 2008

(54) ELECTROSTATIC DISCHARGE PROTECTION DEVICE AND FABRICATION METHOD THEREOF

(75) Inventors: Tai-Hsiang Lai, Miaoli County (TW); Wei-Jen Chang, Miaoli County (TW); Ming-Dou Ker, Hsinchu (TW); Tien-Hao Tang, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/683,753

(22) Filed: Mar. 8, 2007

(51) Int. Cl.
*H01L 31/111* (2006.01)
*H01L 21/328* (2006.01)

(52) U.S. Cl. ............... 257/173; 438/135; 257/E29.105
(58) Field of Classification Search ........... 257/173; 438/135
See application file for complete search history.

(56) References Cited

U.S. PATENT DOCUMENTS

| 6,066,879 A | 5/2000 | Lee et al. |
| 6,459,127 B1 | 10/2002 | Lee et al. |
| 6,576,934 B2 | 6/2003 | Cheng et al. |

OTHER PUBLICATIONS

Jian-Hsing Lee et al, "Novel ESD Protection Structure with Embedded SCR LDMOS for Smart Power Technology" IEEE 40th Annual International Reliability, Physics Symposium, Dallas, Texas, 2002, pp. 156-161.

*Primary Examiner*—Evan Pert
(74) *Attorney, Agent, or Firm*—J.C. Patents

(57) ABSTRACT

An electrostatic discharge (ESD) protection device and a fabrication method thereof are provided. The ESD protection device with an embedded high-voltage P type SCR (EHVPSCR) structure of the present invention is employed to guide the ESD current/voltage to a system voltage trace VDD via a pad.

33 Claims, 5 Drawing Sheets

ELECTROSTATIC DISCHARGE PROTECTION DEVICE AND FABRICATION METHOD THEREOF

BACKGROUND OF THE INVENTION

1. Field of the Invention

The present invention relates to an ESD protection device. More particularly, the present invention relates to an ESD protection device and a fabrication method thereof.

2. Description of Related Art

Electronic devices (e.g., integrated circuits (ICs)) tend to be impacted by electrostatic discharge (ESD) in practical environment. Usually, an ESD protection device is designed between a core circuit and a pad, so as to protect the internal circuits thereof.

Depending on different voltages generated by the ESD, the ESD can be substantially classified into Human-Body Model (HBM), Machine Model (MM), and Charge-Device Model (CDM). The voltage of the ESD is much larger than the system voltage provided in the normal condition. When the ESD occurs, the ESD current is very likely to damage the electronic device. Therefore, several ESD protection measures must be considered for the electronic device, so as to effectively isolate the ESD current to prevent the device from damage. The test of the ESD protection device includes several models, namely, PD, PS, ND, and NS models. In the PD model, a positive pulse is input on the pad, such that a system voltage trace VDD is grounded. In the ND model, a negative pulse is input on the pad, such that the system voltage trace VDD is grounded. In the PS model, the positive pulse is input on the pad, such that a ground voltage trace VSS is grounded. In the NS model, the negative pulse is input on the pad, such that the ground voltage trace VSS is grounded.

FIG. 1 is a layout cross-sectional view of the ESD protection device according to U.S. Pat. No. 6,459,127. Referring to FIG. 1, n-channel metal-oxide-semiconductor (NMOS) transistors T1 and T2 of high-voltage process use parasitic silicon-controlled rectifiers (SCR) to achieve the ESD protection. The NMOS transistors T1 and T2 and the parasitic SCRs thereof are symmetrically disposed such that the current flowing through the parasitic SCRs is uniform. The conventional ESD device may provide sufficient protection against the high voltage level of HBM, where damage caused by only the ESD events of PS and NS models can be prevented. That is to say, the conventional art cannot prevent damage caused due to the ESD events of PD and ND models.

As for the ESD of PD model and ND model, in the conventional art, the ESD current/voltage is first guided from the pad 110 to the ground voltage trace VSS through the parasitic SCR element, and the ESD current/voltage is then guided from the ground voltage trace VSS to the system voltage trace VDD through another ESD protection device (not shown) coupled between the system voltage trace VDD and the ground voltage trace VSS in the IC. Finally, the ESD current/voltage is bypassed from the IC via a power supply pin through the system voltage trace VDD. Since the ESD current/voltage is not directly guided to the system voltage trace VDD from the pad 110, the guide path of the above ESD current/voltage has large parasitic resistance and parasitic capacitance, such that the ESD current/voltage may still damage the core circuit to be protected.

SUMMARY OF THE INVENTION

The present invention is directed to an ESD protection device for preventing ESD of PD model and ND model.

The present invention is also directed to a method of fabricating a high-voltage ESD protection device.

As embodied and broadly described herein, the present invention provides an ESD protection device, which includes a substrate, an N type well, a P type doped region, a first and a second N+ type doped regions, a first and a second P+ type doped regions, a gate, and a first and a second electrodes. The N type well is disposed in the substrate. The P type doped region is disposed in the N type well. The first N+ type doped region and the first P+ type doped region are disposed in the P type doped region. The second N+ type doped region and the second P+ type doped region are disposed in the N type well and outside the P type doped region, and are not in contact with the P type doped region. The gate is disposed on the N type well and between the second P+ type doped region and the P type doped region. The first electrode is electrically connected to the first N+ type doped region and the first P+ type doped region. The second electrode is electrically connected to the second N+ type doped region, the second P+ type doped region and the gate.

The present invention further provides an ESD protection device, which includes an N type substrate, a P type doped region, a first and a second N+ type doped regions, a first and a second P+ type doped regions, a gate, and a first and a second electrodes. The P type doped region is disposed in the N type substrate. The first N+type doped region and the first P+ type doped region are disposed in the P type doped region. The second N+ type doped region and the second P+ type doped region are disposed in the N type substrate and outside the P type doped region, and are not in contact with the P type doped region. The gate is disposed on the N type substrate and between the second P+ type doped region and the P type doped region. The first electrode is connected to the first N+ type doped region and the first P+ type doped region through a first electrical conductor. The second electrode is connected to the second N+ type doped region, the second P+ type doped region, and the gate through a second electrical conductor.

The present invention provides a method of fabricating an ESD protection device, which includes the following steps. A substrate is provided. An N type well is formed in the substrate. A P type doped region is formed in the N type well. A first N+ type doped region and a first P+ type doped region are formed in the P type doped region. A second N+ type doped region and a second P+ type doped region are formed in the N type well and outside the P type doped region, and are not in contact with the P type doped region. A gate is formed on the N type well and between the second P+ type doped region and the P type doped region. And a first electrode and a second electrode are formed over the substrate. The first electrode is connected to the first N+ type doped region and the first P+ type doped region through the first electrical conductor. The second electrode is connected to the second N+ type doped region, the second P+ type doped region, and the gate through the second electrical conductor.

The present invention provides an ESD protection device with an embedded high-voltage P type SCR (EHVPSCR) structure, wherein the ESD current/voltage is guided to a system voltage trace VDD via a pad.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
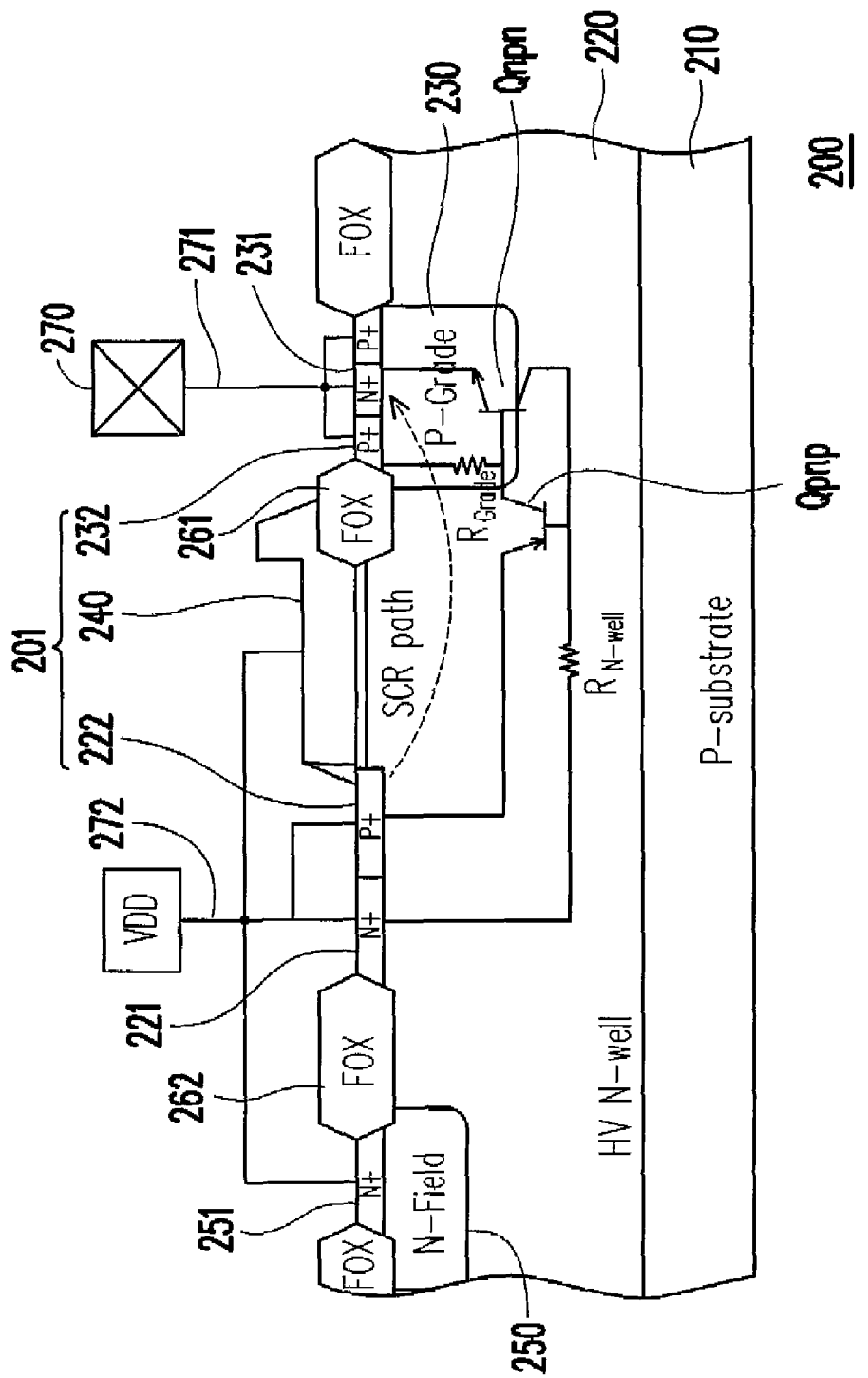
FIG. 2 is a layout cross-sectional view of an ESD protection device according to an embodiment of the present invention.
Figure 3:
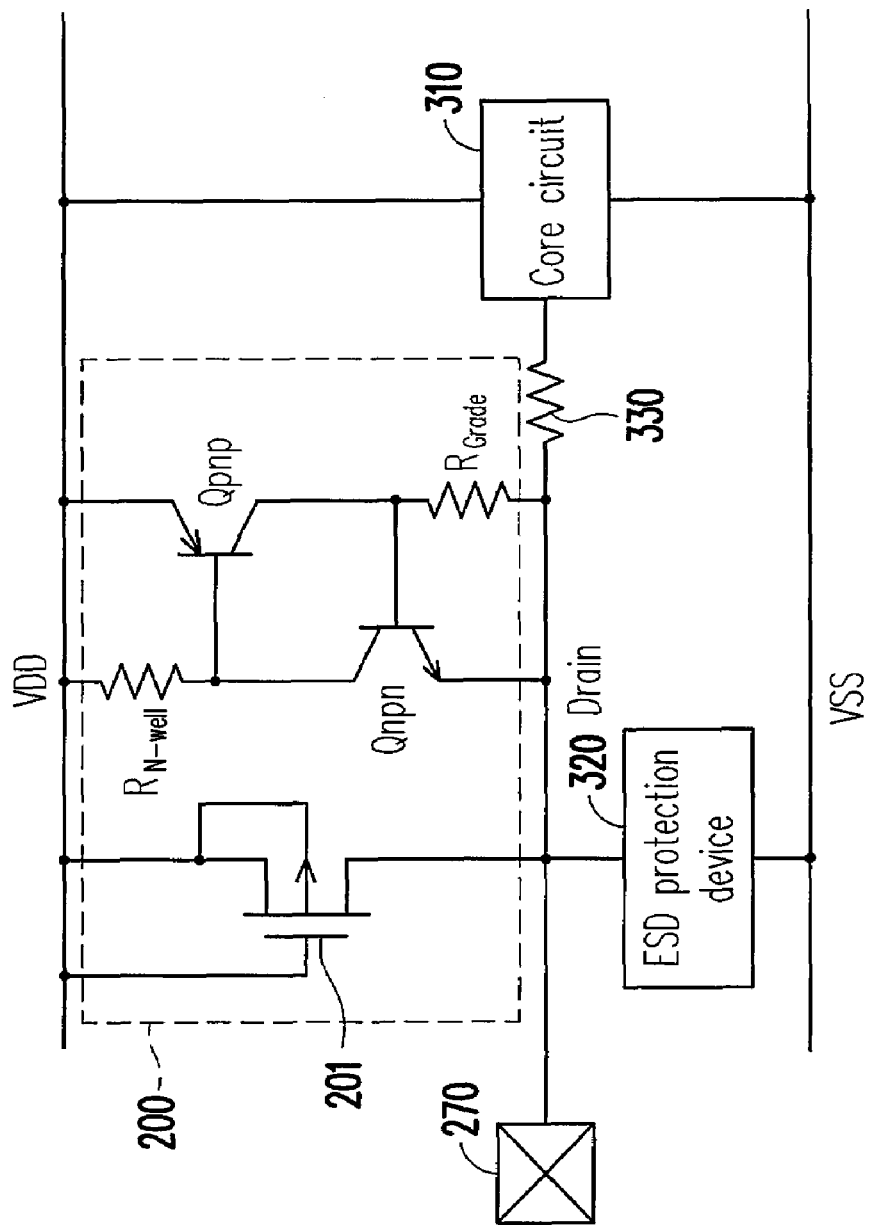
FIG. 3 is an application example of the ESD protection device of FIG. 2 according to the present invention.

FIG. 2 is a layout cross-sectional view of an ESD protection device according to an embodiment of the present invention. FIG. 3 is an application example of an ESD protection device 200 in FIG. 2 according to the present invention. Referring to FIGS. 2 and 3 together, the ESD protection device 200 includes a high-voltage p-channel metal-oxide-semiconductor (PMOS) transistor 201. The high-voltage PMOS transistor 201 is disposed in an N type well (e.g. high voltage N type well 220), and the high voltage (HV) N type well 220 is formed in a P type substrate 210. A P type doped region is formed in the HV N type well 220 to serve as a drain of the high-voltage PMOS transistor 201. The P type doped region is implemented as, for example, a P-Grade 230. A first N+ type doped region 231 and a first P+ type doped region 232 are disposed in the P-Grade 230. In this embodiment, the first P+ type doped region 232 and the first N+ type doped region 231 may be disposed adjacent to each other.

A first electrode 271 is connected to the first N+ type doped region 231 and the first P+ type doped region 232 through a first electrical conductor (e.g., a metal conductor). In this embodiment, the first electrode 271 is electrically connected to a pad 270. In an IC, a core circuit 310 can input/output data from/to the outside through a resistor 330 and the pad 270.

A second N+ type doped region 221 is disposed in the HV N type well 220 and outside the P-Grade 230, and a second P+ type doped region 222 is disposed in the HV N type well 220 and between the second N+ type doped region 221 and the P-Grade 230. The doped regions 221, 222 and the P-Grade 230 are not in contact with each other. The second P+ type doped region 222 and the second N+ type doped region 221 may be disposed adjacent to each other. The second P+ type doped region 222 serves as a source of the high-voltage PMOS transistor 201. A second electrode 272 is connected to the second N+ type doped region 221 and the second P+ type doped region 222 through a second electrical conductor (e.g., a metal conductor). In this embodiment, the second electrode 272 is electrically connected to a system voltage trace VDD.

A gate 240 of the high-voltage PMOS transistor 201 is disposed above the HV N type well 220. A gate oxide layer is used to isolate the gate 240 and the HV N type well 220. The gate 240 is disposed between the second P+ type doped region 222 and the P-Grade 230. In this embodiment, the second electrode 272 is connected to the gate 240 through the electrical conductor. In the IC, the core circuit 310 can obtain an operation power provided from the external power supply through the system voltage trace VDD and a ground voltage trace VSS.

In this embodiment, an N-field 250 is further formed in the HV N type well 220. A third N+ type doped region 251 is disposed in the N-field 250. The third N+ type doped region 251 and the N-field 250 serve as bulk electrodes of the high-voltage PMOS transistor 201. The bulk electrodes of the high-voltage PMOS transistor 201 are connected to the system voltage trace VDD through the electrical conductor. A field oxide layer 262 is disposed in the HV N type well 220, and is disposed between the second N+ type doped region 221 and the third N+ type doped region 251.

The second P+ type doped region 222, the HV N type well 220, and the P-Grade 230 constitute an embedded transistor Qpnp, and the HV N type well 220, the P-Grade 230, and the first N+ type doped region 231 constitute another embedded transistor Qnpn. The embedded transistors Qpnp and Qnpn form one SCR structure, that is, the second P+ type doped region 222, the HV N type well 220, the P-Grade 230, and the first N+ type doped region 231 form one SCR path. An anode gate of the SCR structure is connected to the system voltage trace VDD through an internal resistor $R_{N-well}$ of the second N+ type doped region 221 and the HV N type well 220, and a cathode gate of the SCR structure is connected to the pad 270 through an internal resistor $R_{Grade}$ of the P-Grade 230 and the first P+ type doped region 232.

If the system voltage trace VDD is grounded and a positive pulse of the ESD occurs on the pad 270, the ESD current reaches the system voltage trace VDD through the first P+ type doped region 232, the P-Grade 230, the HV N type well 220, and the second N+ type doped region 221. Therefore, such that the ESD current is guided to the outside of the IC from the pad 270 through the parasitic diode of the ESD protection device 200 and the system voltage trace VDD. Accordingly, the ESD protection device 200 can prevent the ESD current/voltage of PD model from damaging the core circuit 310.

If the system voltage trace VDD is grounded and a negative pulse of the ESD occurs on the pad 270, the ESD voltage will be coupled to the anode gate of the embedded SCR structure. With the internal resistor $R_{N-well}$, the anode gate voltage of the embedded SCR structure is much less than the anode voltage (i.e., the voltage of the system voltage trace VDD) of the embedded SCR structure. Therefore, the embedded SCR structure is triggered, such that the ESD current is guided to the outside of the IC from the system voltage trace VDD through the SCR path and the pad 270. Accordingly, the ESD protection device 200 can prevent ESD current/voltage of ND model from damaging the core circuit 310.

Figure 1:
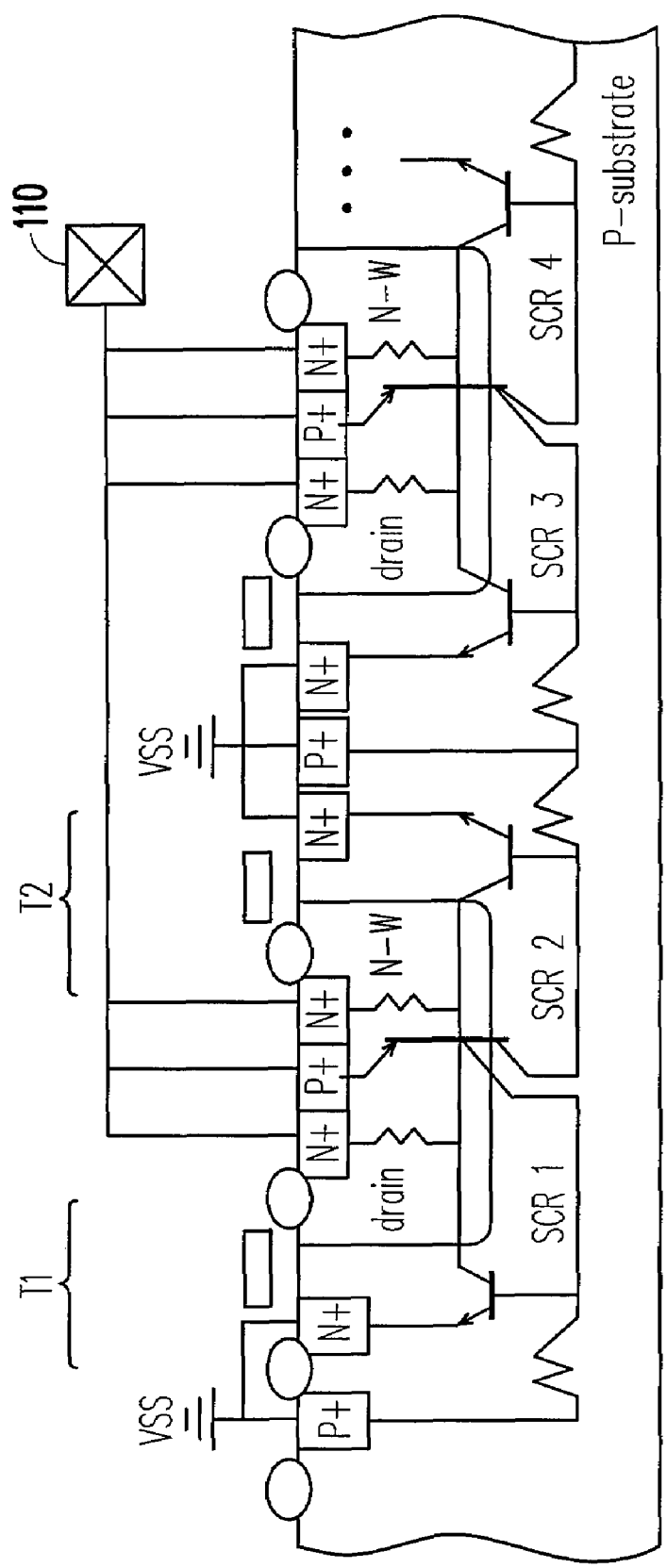
FIG. 1 is a layout cross-sectional view of the ESD protection device according to U.S. Pat. No. 6,459,127.

According to another aspect of the present invention, another ESD protection device 320 may be disposed between the pad 270 and the ground voltage trace VSS. The ESD protection device 320 can be implemented by any means, for example, the ESD protection device 320 is implemented by the device shown in FIG. 1. If the voltage trace VSS is grounded and the positive pulse of the ESD occurs on the pad 270, the ESD voltage will trigger the ESD protection device 320, such that the ESD current is guided to the outside of the IC from the pad 270 through the ESD protection device 320 and the voltage trace VSS. If the voltage trace VSS is grounded and the negative pulse of the ESD occurs on the pad 270, the ESD voltage will trigger the ESD protection device 320, such that the ESD current is guided to the outside of the IC from the voltage trace VSS through the ESD protection device 320 and the pad 270.

In order to avoid triggering the ESD protection device 200 under the normal operation condition, a trigger level of the ESD protection device 200 may be appropriately increased. In this embodiment, a field oxide layer 261 is further disposed in the HV N type well 220 and between the gate 240 and the first P+ type doped region 232. By determining the width and depth of the field oxide layer 261, the trigger level of the ESD protection device 200 may appropriately adjusted.

The ESD protection device 200 may be fabricated by the following method. First, the substrate 210 is provided. The substrate 210 is, for example, a P type doped substrate. Next, the HV N type well 220 is formed in the substrate 210. Next, the P type doped region (the P-Grade 230 in this embodiment) and the N-field 250 are formed in the HV N type well 220.

N+ type doped regions 221, 231, and 251 are formed on the HV N type well 220, and P+ type doped regions 222 and 232 are formed on the HV N type well 220. The N+ type doped region 221 and the P+ type doped region 222 are disposed outside the P-Grade 230 and the N-field 250, the N+ type doped region 231 and the P+ type doped region 232 are disposed in the P-Grade 230, and the N+ type doped region 251 is disposed inside the N-field 250. In this embodiment, the N+ type doped region 221 and the P+ type doped region 222 are disposed adjacent to each other and are not in contact with the P-Grade 230/N-field 250. In addition, the N+ type doped region 231 and the P+ type doped region 232 are disposed adjacent to each other.

Field oxide layers 261 and 262 are formed in the HV N type well 220, in which the field oxide layer 261 is disposed between the gate 240 and the P+ type doped region 232, and the field oxide layer 262 is disposed between the N+ type doped region 221 and the N+ type doped region 251. The gate 240 is formed over the HV N type well 220 and between the P+ type doped region 222 and the P-Grade 230, and the gate oxide layer is used to isolate the gate 240 and the HV N type well 220.

Electrodes 271 and 272 are formed over the substrate 210. The electrode 271 is connected to the N+ type doped region 231 and the P+ type doped region 232 through the electrical conductor. The electrode 272 is connected to the N+ type doped region 221, the P+ type doped region 222, the gate 240, and the N+ type doped region 251 through the electrical conductor. In this embodiment, the electrode 271 is electrically connected to the pad 270, and the electrode 272 is electrically connected to the system voltage trace VDD.

Figure 4:
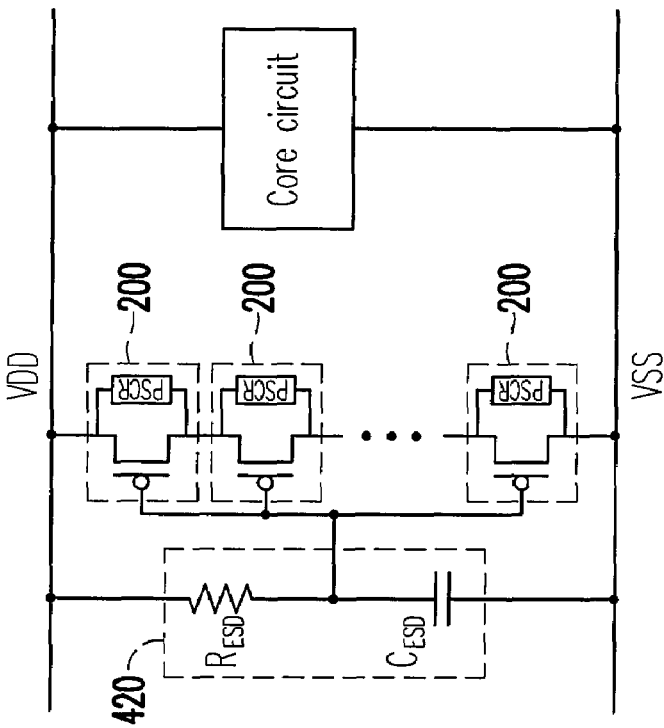
FIG. 4 is another application example of the ESD protection device of FIG. 2 according to the present invention.

One embodiment of the ESD protection device 200 is illustrated in FIG. 3. Those of ordinary skill in the art can apply the ESD protection device 200 of FIG. 2 in other circuits as required. For example, the ESD protection device 200 can be coupled between the voltage traces VDD and VSS. FIG. 4 is another application example of the ESD protection device 200 of FIG. 2 according to the present invention.

Referring to FIG. 4, the embedded SCR structures of the ESD protection devices 200 are represented by blocks PSCR for illustration purpose. In this embodiment, a plurality of ESD protection devices 200 are serially connected between the voltage traces VDD and VSS, and the designer can determine the number of the ESD protection devices 200 serially connected as required. Therefore, when ESD event occurs on the voltage trace VDD (or the voltage trace VSS), the embedded SCR structure of the ESD protection device 200 will be triggered to guide the ESD current to the voltage trace VSS (or the voltage trace VDD) in real-time.

It should be noted that the ESD protection device 200 of this embodiment is somewhat different from the ESD protection device 200 of FIG. 2, and the difference lies in that in this embodiment, the gates 240 of the ESD protection devices 200 are coupled to an ESD detection circuit 420, instead of being connected to the voltage trace VDD. Herein, a resistor $R_{ESD}$ and a capacitor $C_{ESD}$ are serially connected to constitute the ESD detection circuit 420. The ESD detection circuit 420 can be realized by any means by those of ordinary skill in the art. The ESD detection circuits 420 is serially connected between the voltage traces VDD and VSS, so as to detect whether or not the ESD event occurs on the voltage traces VDD and VSS.

Under normal operation condition, as the capacitor $C_{ESD}$ is completely charged, the gate 240 of each ESD protection device 200 remains at a high voltage level (approximate to the voltage level of the voltage trace VDD). Therefore, each ESD protection device 200 remains in an OFF state. When the ESD event occurs on the voltage trace VDD (or the voltage trace VSS), the ESD detection circuit 420 outputs a low voltage level (between the voltage levels of the voltage traces VDD and VSS) to the gate 240 of each ESD protection device 200. Therefore, the PMOS transistor of the ESD protection device 200 is turned on, so as to guide the ESD current to the voltage trace VSS (or the voltage trace VDD) in real-time.

Figure 5:
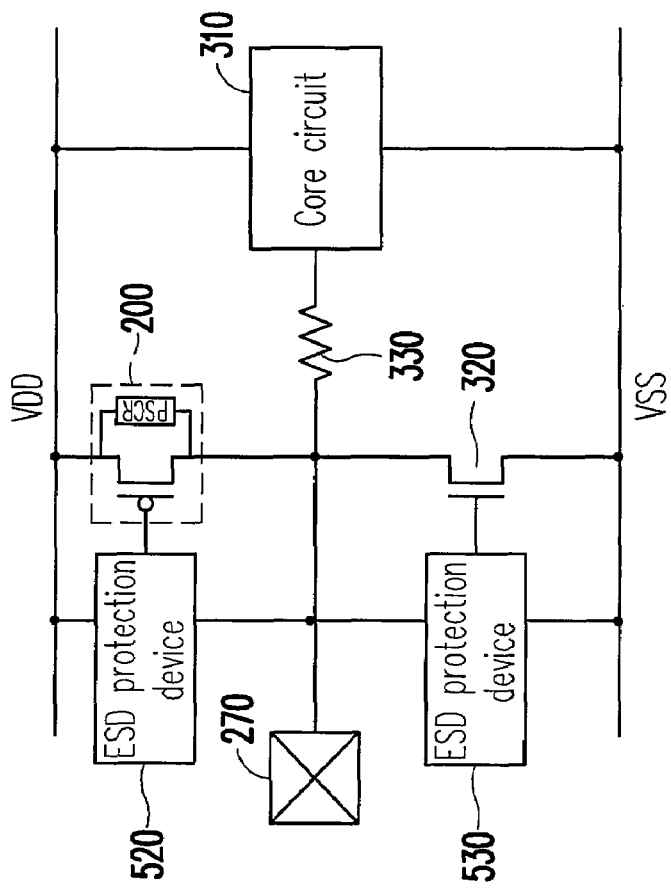
FIG. 5 is still another application example of the ESD protection device of FIG. 2 according to the present invention.

FIG. 5 is another application example of the ESD protection device 200 of FIG. 2 according to the present invention. The embedded SCR structure of the ESD protection device 200 is represented by a block PSCR for the purpose of illustration of the present invention. FIG. 5 is similar to FIG. 3, and thus the details of the same part will not be described repeated herein again. It should be noted that the ESD protection device 200 of this embodiment is somewhat different from the ESD protection device 200 of FIG. 2, and the difference lies in that, in this embodiment, the gate 240 of the ESD protection device 200 is coupled to the ESD detection circuit 520 instead of being connected to the voltage trace VDD. The ESD detection circuit 520 can be realized by any means by those of ordinary skill in the art as required. Referring to FIG. 5, the ESD detection circuit 520 is serially connected between the voltage trace VDD and the pad 270, so as to detect whether or not the ESD event occurs on the voltage trace VDD and the pad 270. An ESD detection circuit 530 is serially connected between the pad 270 and the voltage trace VSS, so as to detect whether or not the ESD event occurs on the pad 270 and the voltage trace VSS.

Under normal operation condition, the ESD detection circuit 520 outputs a high voltage level (approximate to the voltage level of the voltage trace VDD) to the gate 240 of the ESD protection device 200, and the ESD detection circuit 530 outputs a low voltage level (approximate to the voltage level of the voltage trace VSS) to the gate of the ESD protection device 320. Therefore, the ESD protection devices 200 and 320 remains in the OFF state.

When the ESD event occurs, if the system voltage trace VDD is grounded and the ESD pulse occurs on the pad 270, the ESD detection circuit 520 outputs a low voltage level (between the voltage levels of the pad 270 and the voltage trace VDD) to the gate 240 of the ESD protection device 200. Therefore, the PMOS transistor of the ESD protection device 200 is turned on, so as to guide the ESD current from the pad 270 to the voltage trace VDD in real-time, or guide the ESD current from the voltage trace VDD to the pad 270 in real-time.

If the system voltage trace VSS is grounded and the ESD pulse occurs on the pad 270, the ESD detection circuit 530 outputs a high voltage level (between the voltage levels of the pad 270 and the voltage trace VSS) to the gate of the ESD protection device 320. Therefore, the NMOS transistor of the ESD protection device 320 is turned on, so as to guide the ESD current from the pad 270 to the voltage trace VSS in real-time, or guide the ESD current from the voltage trace VSS to the pad 270 in real-time.

Figure 6:
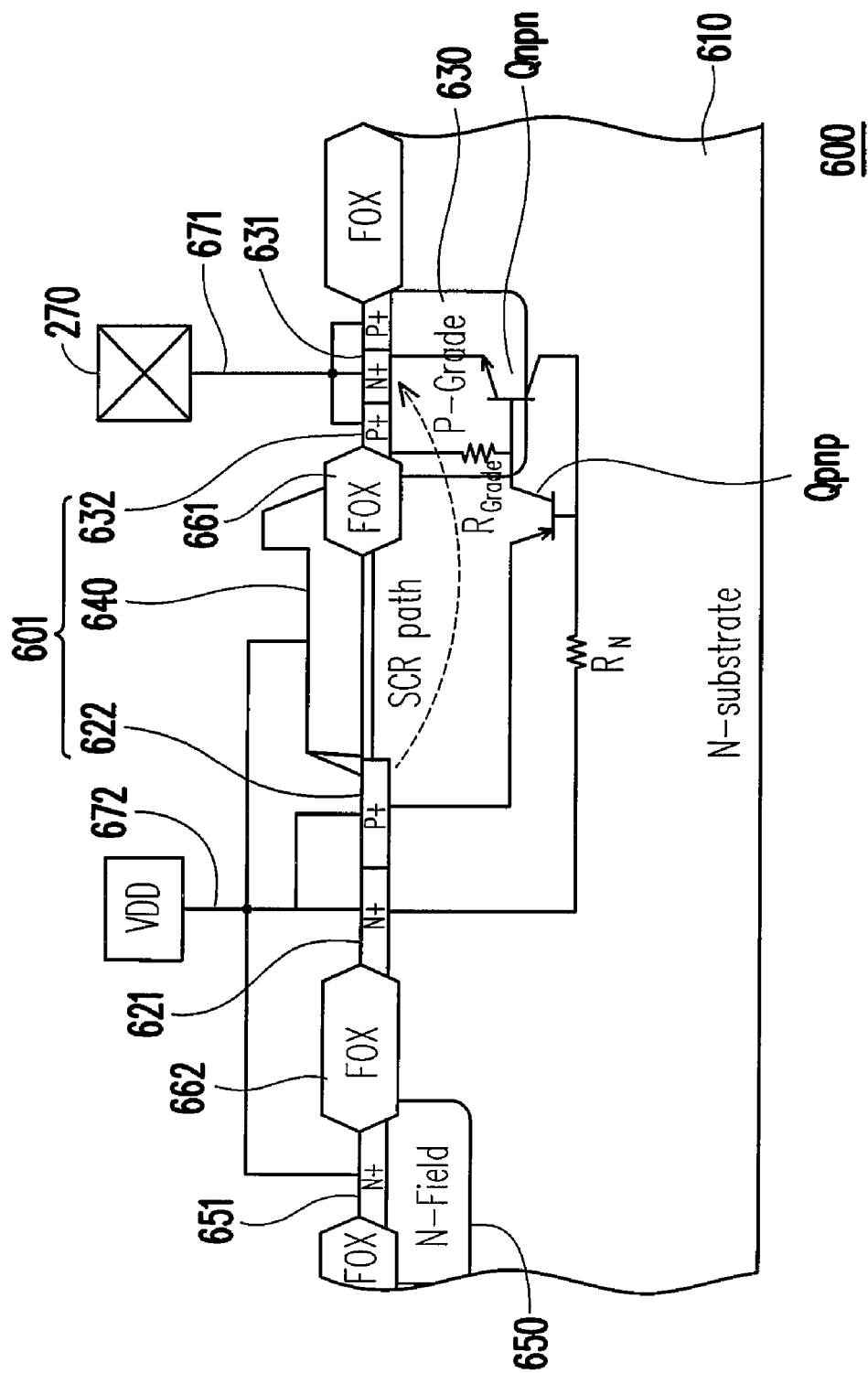
FIG. 6 is a layout cross-sectional view of the ESD protection device according to another embodiment of the present invention.

Another embodiment of the present invention is illustrated below. FIG. 6 is a layout cross-sectional view of another implementation example of the ESD protection device according to the present invention. Referring to FIG. 6, an ESD protection device 600 includes a high-voltage PMOS transistor 601. The high-voltage PMOS transistor 601 is disposed in an N type substrate 610. A P type doped region is formed in the N type substrate 610 to serve as a drain of the high-voltage PMOS transistor 601. The above-mentioned P type doped region is implemented as, for example, a P-Grade 630. A first N+ type doped region 631 and a first P+ type doped region 632 are disposed in the P-Grade 630. In this embodiment, the first P+ type doped region 632 and the first N+ type doped region 631 may be disposed adjacent to each other. A first electrode 671 is connected to the first N+ type doped region 631 and the first P+ type doped region 632 through the electrical conductor (e.g., the metal conductor). The first electrode 671 can be electrically connected to the pad 270.

A second N+ type doped region 621 is disposed in the N type substrate 610 and outside the P-Grade 630, and a second P+ type doped region 622 is disposed in the N type substrate 610 and between the second N+ type doped region 621 and the P-Grade 630. The doped region 621, 622 are not in contact with the P-Grade 630, and the doped regions 622 and 621 may be adjacent to each other. The second P+ type doped region 622 serves as a source of the high-voltage PMOS transistor 601. A second electrode 672 is connected to the second N+ type doped region 621 and the second P+ type doped region 622 through the electrical conductor (e.g., the metal conductor). In this embodiment, the second electrode 672 is electrically connected to the system voltage trace VDD.

A gate 640 of the high-voltage PMOS transistor 601 is disposed over the N type substrate 610. Herein, a gate oxide layer is used to isolate the gate 640 and the N type substrate 610. The gate 640 is disposed between the second P+ type doped region 622 and the P-Grade 630. In this embodiment, the second electrode 672 is connected to the gate 640 through the electrical conductor.

In this embodiment, an N-field 650 is further formed in the N type substrate 610. A third N+ type doped region 651 is disposed in the N-field 650. The third N+ type doped region 651 and the N-field 650 serve as bulk electrodes of the high-voltage PMOS transistor 601. The bulk electrodes of the high-voltage PMOS transistor 601 are also connected to the system voltage trace VDD through the electrical conductor. A field oxide layer 662 is disposed in the N type substrate 610, and between the second N+ type doped region 621 and the third N+ type doped region 651.

The second P+ type doped region 622, the N type substrate 610, and the P-Grade 630 constitute an embedded transistor Qpnp, and the N type substrate 610, the P-Grade 630, and the first N+ type doped region 631 constitute another embedded transistor Qnpn. The embedded transistors Qpnp and Qnpn form one embedded SCR structure, that is, the second P+ type doped region 622, the N type substrate 610, the P-Grade 630, and the first N+ type doped region 631 form an SCR path. An anode gate of the embedded SCR structure is connected to the system voltage trace VDD through an internal resistor $R_N$ of the second N+ type doped region 621 and the N type substrate 610, and a cathode gate of the embedded SCR structure is connected to the pad 270 through an internal resistor $R_{Grade}$ of the P-Grade 630 and the first P+ type doped region 632.

If the system voltage trace VDD is grounded and the positive pulse of ESD occurs on the pad 270, the ESD current reaches the system voltage trace VDD through the first P+ type doped region 632, the P-Grade 630, the N type substrate 610, and the second N+ type doped region 621. Therefore, such that the ESD current is guided to the outside of the IC from the pad 270 through the parasitic diode of the ESD protection device 600 and the system voltage trace VDD. If the system voltage trace VDD is grounded and the negative pulse of ESD occurs on the pad 270, the ESD voltage will be coupled to the anode gate of the embedded SCR structure. With the internal resistor $R_N$, the anode gate voltage of the embedded SCR structure is much less than the anode voltage of the embedded SCR structure (i.e., the voltage of the system voltage trace VDD). Therefore, the embedded SCR structure is triggered, such that the ESD current is guided bypassing the IC from the system voltage trace VDD via the SCR path and the pad 270.

In order to avoid triggering the ESD protection device 600 under the normal operation condition, the trigger level of the ESD protection device 600 may be increased appropriately. In this embodiment, a field oxide layer 661 is further disposed in the N type substrate 610 and between the gate 640 and the first P+ type doped region 632. By determining the width and depth of the field oxide layer 661, the trigger level of the ESD protection device 600 may be adjusted appropriately.

In view of the above, the ESD current/voltage can be directly guided from the pad to the system voltage trace VDD.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection device, comprising:
   a substrate;
   an N type well, disposed in the substrate;
   a P type doped region, disposed in the N type well;
   a first N+ type doped region, disposed in the P type doped region;
   a first P+ type doped region, disposed in the P type doped region;
   a second P+ type doped region, disposed in the N type well and outside the P type doped region, wherein the second P+ type doped region and the P type doped region are not in contact with each other;

a gate, disposed on the N type well and between the second P+ type doped region and the P type doped region;

a first electrode, connected to the first N+ type doped region and the first P+ type doped region through a first electrical conductor; and a second electrode, connected to the second P+ type doped region, and the gate through a second electrical conductor.

2. The ESD protection device as claimed in claim 1, wherein the P type doped region is a P-Grade.

3. The ESD protection device as claimed in claim 1, further comprising a first field oxide layer disposed in the N type well and between the gate and the first P+ type doped region.

4. The ESD protection device as claimed in claim 1, further comprising:
a second N+ type doped region, disposed in the N type well and outside the P type doped region, wherein the second N+ type doped region and the P type doped region are not in contact with each other.

5. The ESD protection device as claimed in claim 4, wherein the second P+ type doped region is disposed adjacent to the second N+ type doped region.

6. The ESD protection device as claimed in claim 1, further comprising:
an N-field, disposed in the N type well; and
a third N+ type doped region, disposed in the N-field, wherein the second electrode is connected to the third N+ type doped region through the second electrical conductor.

7. The ESD protection device as claimed in claim 6, further comprising a second field oxide layer disposed in the N type well and between the second P+ type doped region and the third N+ type doped region.

8. The ESD protection device as claimed in claim 1, wherein the first electrode is electrically connected to a pad.

9. The ESD protection device as claimed in claim 1, wherein the second electrode is electrically connected to a system voltage trace.

10. The ESD protection device as claimed in claim 1, wherein the first electrical conductor and the second electrical conductor are metal.

11. The ESD protection device as claimed in claim 1, wherein the first P+ type doped region is disposed adjacent to the first N+ type doped region.

12. An ESD protection device, comprising:
an N type substrate;
a P type doped region, disposed in the N type substrate;
a first N+ type doped region, disposed in the P type doped region;
a first P+ type doped region, disposed in the P type doped region;
a second P+ type doped region, disposed in the N type substrate and outside the P type doped region, wherein the second P+ type doped region and the P type doped region are not in contact with each other;
a gate, disposed on the N type substrate and between the second P+ type doped region and the P type doped region;
a first electrode, connected to the first N+ type doped region and the first P+ type doped region through a first electrical conductor; and
a second electrode, connected to the second P+ type doped region, and the gate through a second electrical conductor.

13. The ESD protection device as claimed in claim 12, wherein the P type doped region is a P-Grade.

14. The ESD protection device as claimed in claim 12, further comprising a first field oxide layer disposed in the N type substrate and between the gate and the first P+ type doped region.

15. The ESD protection device as claimed in claim 12, further comprising:
a second N+ type doped region, disposed in the N type substrate and outside the P type doped region, wherein the second N+ type doped region and the P type doped region are not in contact with each other.

16. The ESD protection device as claimed in claim 15, wherein the second P+ type doped region is disposed adjacent to the second N+ type doped region.

17. The ESD protection device as claimed in claim 12, further comprising:
an N-field, disposed in the N type substrate; and
a third N+ type doped region, disposed in the N-field, wherein the second electrode is connected to the third N+ type doped region through the second electrical conductor.

18. The ESD protection device as claimed in claim 17, further comprising a second field oxide layer disposed in the N type substrate and between the second P+ type doped region and the third N+ type doped region.

19. The ESD protection device as claimed in claim 12, wherein the first electrode is electrically connected to a pad.

20. The ESD protection device as claimed in claim 12, wherein the second electrode is electrically connected to a system voltage trace.

21. The ESD protection device as claimed in claim 12, wherein the first electrical conductor and the second electrical conductor comprise metal.

22. The ESD protection device as claimed in claim 12, wherein the first P+ type doped region is disposed adjacent to the first N+ type doped region.

23. A method of fabricating an ESD protection device, comprising:
providing a substrate;
forming an N type well in the substrate;
forming a P type doped region in the N type well;
forming a first N+ type doped region in the P type doped region;
forming a first P+ type doped region in the P type doped region;
forming a second P+ type doped region in the N type well and outside the P type doped region, wherein the second P+ type doped region and the P type doped region are not in contact with each other;
forming a gate on the N type well and between the second P+ type doped region and the P type doped region;
forming a first electrode, wherein the first electrode is connected to the first N+type doped region and the first P+ type doped region through a first electrical conductor; and
forming a second electrode, wherein the second electrode is connected to the second P+ type doped region, and the gate through a second electrical conductor.

24. The production method of an ESD protection device as claimed in claim 23, wherein the P type doped region is a P-Grade.

25. The production method of an ESD protection device as claimed in claim 23, further comprising:

forming a first field oxide layer in the N type well and between the gate and the first P+ type doped region.

26. The production method of an ESD protection device as claimed in claim 23, further comprising:
forming a second N+ type doped region in the N type well and outside the P type doped region, wherein the second N+ type doped region and the P type doped region are not in contact with each other.

27. The production method of an ESD protection device as claimed in claim 26, wherein the second P+ type doped region is disposed adjacent to the second N+ type doped region.

28. The production method of an ESD protection device as claimed in claim 23, further comprising:
forming a N-field in the N type well; and
forming a third N+ type doped region in the N-field, wherein the second electrode is connected to the third N+ type doped region through the second electrical conductor.

29. The production method of an ESD protection device as claimed in claim 28, further comprising:
forming a second field oxide layer in the N type well and between the second P+ type doped region and the third N+ type doped region.

30. The production method of an ESD protection device as claimed in claim 23, wherein the first electrode is electrically connected to a pad.

31. The production method of an ESD protection device as claimed in claim 23, wherein the second electrode is electrically connected to a system voltage trace.

32. The production method of an ESD protection device as claimed in claim 23, wherein the first electrical conductor and the second electrical conductor comprise metal.

33. The production method of an ESD protection device as claimed in claim 23, wherein the first P+ type doped region is disposed adjacent to the first N+ type doped region.

* * * * *